United States Patent
Rowell et al.

(10) Patent No.: US 10,935,596 B2
(45) Date of Patent: Mar. 2, 2021

(54) TEST SYSTEM AND METHOD WITH A THERMALLY ISOLATED HOLLOW BODY INSIDE AN OVER THE AIR MEASUREMENT CHAMBER

(71) Applicant: Rohde & Schwarz GmbH & Co. KG, Munich (DE)

(72) Inventors: Corbett Rowell, Munich (DE); Stefan Ullrich, Tutzing (DE); Heiko Kuehling, Neubiberg (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 244 days.

(21) Appl. No.: 16/041,403

(22) Filed: Jul. 20, 2018

(65) Prior Publication Data
US 2020/0025822 A1   Jan. 23, 2020

(51) Int. Cl.
*G01R 31/28* (2006.01)
*G01R 29/10* (2006.01)
*G01R 31/00* (2006.01)

(52) U.S. Cl.
CPC ....... *G01R 31/2874* (2013.01); *G01R 29/105* (2013.01); *G01R 31/003* (2013.01)

(58) Field of Classification Search
CPC .............. G01R 31/2874; G01R 29/105; G01R 31/003; G01R 29/0821
USPC ........................................ 324/750.03, 750.08
See application file for complete search history.

(56) References Cited

U.S. PATENT DOCUMENTS

| | | | |
|---|---|---|---|
| 4,303,818 A * | 12/1981 | Smith | H05B 6/6458 219/707 |
| 5,134,405 A | 7/1992 | Ishihara et al. | |
| 2013/0125676 A1 * | 5/2013 | Tockstein | B64G 7/00 73/865.6 |
| 2016/0325126 A1 | 11/2016 | Swift | |

(Continued)

FOREIGN PATENT DOCUMENTS

| CN | 102882613 A | 1/2013 |
|---|---|---|
| EP | 1808703 A1 | 7/2007 |

(Continued)

OTHER PUBLICATIONS

Foged et al., "Thermal testing of small antennas in spherical near field system", Published in IEEE International Conference on Microwaves, Communications, Antennas and Electronic Systems (COMCAS Nov. 7, 2011), 7 pages.

(Continued)

*Primary Examiner* — Farhana A Hoque
(74) *Attorney, Agent, or Firm* — Ditthavong & Steiner P.C.

(57) ABSTRACT

The invention relates to an over-the-air (OTA) test system for measuring a performance of a device under test (DUT). The test system comprises an over-the-air (OTA) measurement chamber provided with at least one feedthrough for at least a first air hose and a second air hose. The test system further includes a thermally isolated hollow body inside the OTA measurement chamber, in which the DUT is positioned having at least two openings for connecting a first end of each of the first and the second air hose, and at least one sensor having a connection wire, located within the thermally isolated hollow body. Advantageously, the sensor connection wire is fed through one of the two openings into the thermally isolated hollow body.

18 Claims, 4 Drawing Sheets

(56) References Cited

U.S. PATENT DOCUMENTS

2017/0016944 A1* 1/2017 Esplin .................. G01R 29/105
2018/0058970 A1* 3/2018 Garre ...................... G01L 27/00

FOREIGN PATENT DOCUMENTS

| JP | 2007101445 A | 4/2007 |
|----|--------------|--------|
| JP | 2008166474 A | 7/2008 |
| WO | 0034795 A1 | 6/2000 |

OTHER PUBLICATIONS

Schroeder et al., "Direct Measurement of Small Antenna Radiation Efficiency by Callrimetric Method", published in IEEE Transactions on Antennas and Propagation, vol. 54, No. 9, Sep. 1, 2006, 11 pages.

* cited by examiner

TEST SYSTEM AND METHOD WITH A THERMALLY ISOLATED HOLLOW BODY INSIDE AN OVER THE AIR MEASUREMENT CHAMBER

TECHNICAL FIELD

The invention relates to an over-the-air test system and method for measuring a performance of a device under test (DUT). The test system comprises an over-the-air (OTA) measurement chamber provided with at least one feedthrough for at least a first air hose and a second air hose.

BACKGROUND ART

Over the last years, the use of wireless communication applications has increased tremendously and will further increase. Generally, wireless, enabled devices have to pass a variety of industry and regulatory certifications before they can be put on the marked. Performance testing such as OTA (Over-The-Air) measurement is one important measurement required for said wireless devices. OTA measurements are specifically performed to measure antenna patterns and include the measurement of the radiated transmit power (TRP) of a device under test at incremental locations surrounding the device.

Since wireless communication applications are exposed to different ambient conditions such as varying temperature, air-pressure or humidity, there is a need to generate desired ambient conditions around a device under test (DUT) and to measure and/or monitor the ambient condition parameters such as temperature, air-pressure or humidity.

JP 2008 166474 A, relates to an environmental test apparatus that is capable of changing the ambient conditions such as temperature and humidity around a device under test (DUT) while measuring unwanted radiation generated by a DUT such as an electronic device in an anechoic chamber. The cited document discloses a shielded anechoic measurement chamber comprising an environmental test apparatus that includes a metallic casing having an air-conditioned room on which a cover with a cylindrical shape with an upper portion closed is mounted. The cover positioned onto the metallic casing forms a test chamber surrounding the DUT placed on the metallic casing.

According to JP 2008 166474 A the metallic casing has a cylindrical side wall and a ceiling and a floor provided on the upper and lower surfaces of the side wall. The metallic casing includes a heater, a humidifier, a heat pipe and a Peltier element providing dehumidifying and cooling means. The ceiling of the metallic casing has a circular table-shaped turntable and a guide member for guiding the turntable. Two through holes are formed between the test chamber and the air-conditioned room to allow air flow between the two volumes. Air with a specific temperature and humidity is blown from the air-conditioned room through one of the two through holes determined for air inflow into the test chamber. Before the air leaves the test chamber via the other of the two through holes determined for air outflow, it passes a temperature/humidity sensor, located near the through hole for the air outflow.

However, even though the cited document discloses a test chamber including a temperature/humidity sensor for testing a DUT, wherein the chamber allows to set ambient conditions such as temperature and humidity around the DUT, the document is absolutely silent regarding the wiring of the sensor. Furthermore, JP 2008 166474 A teaches that the test chamber and the air-conditioned room are both located within the shielded anechoic measurement chamber, which requires a lot of space and which requires larger, more expensive measurement chambers. Moreover, even if the electromagnetic radiation generated by the components within the air-conditioned room is shielded by using metallic meshes at the through holes, the probability of having unintended radiation inside the test chamber is quite high, since the meshes could get loose over time and it is further possible that said meshes are not accurately mounted after maintenance. Moreover, the wiring for the components within the air-conditioned room such as heater, Peltier element, humidifier, etc., has to be fed into the shielded chamber, which causes disturbances of the OTA measurement circuit.

Accordingly, there is a need to provide a measurement system and a method for OTA measurements of a DUT allowing the control and measurement of atmospheric parameters such as temperature, air-pressure preferably barometric-pressure or humidity inside a thermally isolated hollow body located inside a shielded chamber. Cable connected sensors shall be easily mountable within said hollow body without the need for specific preparation, in other words without the need to create openings for the insertion of said cable connected sensor into the thermally isolated hollow body.

SUMMARY OF THE INVENTION

According to a first aspect of the invention, an over-the-air (OTA) test system for measuring a performance of a device under test (DUT) is provided. The test system comprises an over-the-air (OTA) measurement chamber provided with at least one feedthrough for at least a first air hose and a second air hose. The test system further includes a thermally isolated hollow body inside the OTA measurement chamber, in which the DUT is positioned having at least two openings for connecting a first end of each of the first and the second air hose, and at least one sensor having a connection wire or a connection cable, located within the thermally isolated hollow body. Advantageously, the sensor connection wire respectively the sensor connection cable is fed through one of the two openings into the thermally isolated hollow body. Within this application the term sensor connection wire or connection wire is used as a synonym for the wording sensor connection cable or connection cable.

Advantageously, a thermally isolated hollow body is provided within an OTA measurement chamber to ensure that the temperature of the air within the hollow body is not influenced by the temperature within the OTA measurement chamber and vice versa. It might be required to test a device under test (DUT) at low temperatures, preferably up to minus 40 degrees Celsius (−40° C.) and at high temperatures, preferably up to plus 85 degrees Celsius (+85° C.). Such temperatures are not suitable for measurement equipment required to perform the OTA measurements. By providing a thermally isolated hollow body and positioning the DUT within said body, the DUT can be tested at high and low temperatures without influencing the temperature within the OTA measurement chamber containing measurement equipment. Moreover, since the volume of the thermally isolated hollow body can be adapted to the size of the DUT and therefore the volume can be reduced compared to the volume of the overall OTA measurement chamber, stable ambient conditions can be reached much faster inside the smaller volume.

Furthermore, the OTA measurement chamber, in which the thermally isolated hollow body is located, is not affected by low or high humidity levels inside the thermally isolated hollow body. Thus, various ambient conditions within the thermally isolated hollow body, which might not be acceptable for the measurement equipment within the OTA measurement chamber are present only within the thermally isolated hollow body and do not affect the ambient conditions within the OTA chamber.

Furthermore, the thermally isolated hollow body ensures that stable ambient conditions such as stable temperatures can be reached, since no temperature loss due to the thermally isolated hollow body can take place.

It is further advantageous that the same opening in the thermally isolated hollow body is used for two different applications. On the one hand, the opening is used to connect an air hose to the thermally isolated hollow body and on the other hand, the same opening is used to guide a sensor connection wire preferably the wire including the sensor through said opening. Thus, less openings are required to be drilled into or provided with the thermally isolated hollow body, which reduces temperature losses and manufacturing effort. Every additional opening in the thermally isolated hollow body increases the probability that an unwanted temperature exchange between the air within the thermally isolated hollow body and the air within the OTA measurement chamber takes place through said additional opening.

Advantageously, the feedthrough provided with the OTA measurement chamber allows to feed hoses such as air hoses and wiring such as one or more wires and/or one or more cables from the outside of the OTA measurement chamber into the inside of the OTA measurement chamber and from the inside of the chamber to the outside of the chamber. It is conceivable that one feedthrough comprising several openings for several air hoses and/or wires and/or cables is provided or that two or more separate feedthroughs for feeding air hoses and/or wires and/or cables through the wall of the OTA measurement chamber are provided.

According to a first preferred implementation form of the first aspect, the sensor connection wire enters in the feedthrough of the OTA measurement chamber at a separate location as the first and/or the second air hose.

Advantageously, since the sensor connection wire enters the feedthrough from the outside of the OTA measurement chamber at a separate location as the first and/or second air hose, any wiring can be used to be fed inside the feedthrough. In other words, no specific hose that includes one or more connection wires has to be provided.

According to a further preferred implementation form of the first aspect, the sensor connection wire passes through the feedthrough and is embedded into the first air hose and/or the second air hose inside the feedthrough of the OTA measurement chamber.

Advantageously, the sensor connection wire that enters the feedthrough from the outside of the OTA measurement chamber at a separate location than the air hose is put into the air hose inside the feedthrough. To put the sensor connection wire into the air hose requires to make a small opening, exemplarily a hole into the air hose, which results in a leakage that would cause air within the air hose to exit the air hose or to cause air flowing from the outside of the hose into said hose. However, since the sensor connection wire is put into the hole in the air hose within the feedthrough, the feedthrough serves as a kind of seal and prevents that air leaves the air hose or that air gets inside the air hose through said hole. Thus, no additional means are required to seal the opening, respectively the hole in the air hose after having inserted the sensor connection wire.

According to a further preferred implementation form of the first aspect, the system further includes a heated and/or cooled air generator to control the ambient, conditions within the thermally isolated hollow body.

Advantageously, a heated and/or cooled air generator is provided to control the ambient conditions within the thermally isolated hollow body. The generator is preferably capable of blowing air of a pre-defined temperature and humidity via one of the two air hoses into the thermally isolated hollow body and sucking out the air of the thermally isolated hollow body via one of the two air hoses. The heated and/or cooled air generator is further capable of maintaining a defined air-pressure, within the thermally isolated hollow body.

According to a further preferred implementation form of the first aspect, a second end of the first air hose and/or the second air hose is connected to the heated and/or cooled air generator.

Advantageously, the heated and/or cooled air generator provides connection means for the second end of the first air hose and the second end of the second air hose. It is further conceivable that two different heated and/or cooled air generator units are provided, wherein each unit can be connected to one of the second ends of the first air hose and the second air hose.

According to a further preferred implementation form of the first aspect, the first air hose is used for air intake into the thermally isolated hollow body and/or wherein the second air hose is used for air outtake of the thermally isolated hollow body.

Advantageously, by defining exactly which air hose is used for air intake and air outtake any desired heated and/or cooled air generator can be connected to the air hoses and the ideal position of the sensor within the thermally isolated hollow body can be determined.

According to a further preferred implementation form of the first aspect, at least one of the one or more sensors is a temperature sensor and/or a humidity sensor and/or an air-pressure sensor, preferably a sensor to measure barometric pressure.

Advantageously, the sensors provided are capable of measuring ambient condition values such as ambient temperature, preferably in degrees Celsius (° C.), humidity, preferably the relative humidity in percent (%) and air-pressure respectively barometric pressure, preferably in hectopascal (hPa). Since wireless products are used in different ambient conditions it is desirable to test a DUT for such conditions by generating various ambient conditions around the DUT and to measure and monitor the ambient condition values around the DUT during OTA testing of the DUT.

According to a further preferred implementation form of the first aspect, the at least one sensor is directly attached to the DUT.

Advantageously, especially temperatures at the DUT enclosure or near the DUT antenna can be measured by directly attaching a temperature sensor to the DUT.

According to a further preferred implementation form of the first aspect, the at least one sensor is positioned near the DUT.

Advantageously, the temperature, humidity and barometric pressure near the DUT can be measured, which might be required by certification bodies or specific test plans.

According to a further preferred implementation form of the first aspect, the thermally isolated hollow body is made of a radio frequency (RF) transparent material.

Advantageously, to allow accurate DUT performance measurement, the material of the thermally isolated hollow body is made of radio frequency (RF) transparent material. Preferably, the material is RF transparent in the RF range of 20-50 GHz (Gigaherz). RF transparent within this application preferably means that in the 20-50 GHz range, the RF radiation is attenuated by 0.16 dB at maximum.

According to a further preferred implementation form of the first aspect, said temperature sensor is configured to measure the temperature of a DUT and to transmit the measurement data to a heated and/or cooled air generator. It is further conceivable that the temperature sensor is additionally or alternatively connected to a control unit for measuring and/or monitoring the temperature within the thermally isolated hollow body and for triggering certain events when a temperature threshold is exceeded or undershot. The trigger event is not necessarily related to the control of the ambient conditions within the thermally isolated hollow body but the trigger event may be a specific test program that is started or stopped.

Advantageously, the temperature sensor is connected to the heated and/or cooled air generator and thus provides the required temperature data for regulating the ambient temperature within the thermally isolated hollow body.

According to a further preferred implementation form of the first aspect, said humidity sensor is configured to measure the humidity or condensation within the thermally isolated hollow body and to transmit the measurement data to a heated and/or cooled air generator. It is further conceivable that the humidity sensor is additionally or alternatively connected to a control unit for measuring and/or monitoring the humidity and/or condensation within the thermally isolated hollow body and for triggering certain events when a humidity threshold and/or a condensation threshold is exceeded or undershot. The trigger event is not necessarily related to the control of the ambient conditions within the thermally isolated hollow body but the trigger event may be a specific test program that is started or stopped.

Advantageously, the humidity sensor is connected to the heated and/or cooled air generator and thus provides the required humidity and/or condensation data for regulating the ambient humidity and/or condensation within the thermally isolated hollow body.

According to a further preferred implementation form of the first aspect, if the measured humidity or condensation is above a predefined level, the air goes through several heating and cooling cycles to remove the humidity or condensation.

Advantageously, the heated and/or cooled air generator is capable of reducing the humidity level and/or the condensation level of the air circulating within the system consisting of the thermally isolated hollow body, the two air hoses and the heated and/or cooled air generator. Thus, the humidity level and/or the condensation level of the air supplied into the thermally isolated hollow body can be controlled. When a certain humidity level and/or condensation level is exceeded, which is sensed by the humidity sensor and converted into appropriate sensor signals transmitted to the heated arid/or cooled air generator, the air passing through the heated and/or cooled air generator is heated up and cooled down to reduce the humidity and/or the condensation.

According to a second aspect of the invention, a method for measuring a performance of a device under test (DUT) is provided. The method comprises the step of supplying at least a first air hose and a second air hose into an over-the-air (OTA) measurement chamber by means of a feedthrough. The method further comprises the steps of providing inside the OTA measurement chamber a thermally isolated hollow body with at least two openings, connecting a first end of the first air hose to one opening in the thermally isolated hollow body and connecting a first end of the second air hose to another opening in the thermally isolated hollow body. Additionally the method includes the step of providing a sensor having a connection wire inside the thermally isolated hollow body, and feeding the sensor connection wire through one of the two openings within the thermally isolated hollow body.

According to a first preferred implementation form of the second aspect, the method further comprises the steps of guiding the sensor connection wire outside the first and second air hose outside the OTA measurement chamber, embedding the sensor connection wire inside the first and/or the second air hose within the feedthrough, and further the step of guiding the sensor connection wire inside the first and/or second air hose inside the OTA measurement chamber.

According to a further preferred implementation form of the second aspect, the method further comprises the step of guiding the sensor connection wire such that it enters in the feedthrough within the OTA measurement chamber at a separate location as the first and/or second air hose.

According to a further preferred implementation form of the second aspect, the method further comprises the step of positioning the at least one sensor inside the thermally isolated hollow body such that the sensor is located near the DUT and/or such that the sensor is directly attached to the OUT.

According to a further preferred implementation form of the second aspect, the method further comprises the step of controlling the ambient conditions within the thermally isolated hollow body with the aid of a heated and/or cooled air generator based on received sensor data from at least one sensor inside the thermally isolated hollow body.

BRIEF DESCRIPTION OF THE DRAWING

Exemplary embodiments of the invention are now further explained with respect to the drawings by way of example only, and not for limitation. In the drawings.

DETAILED DESCRIPTION OF THE PREFERRED EMBODIMENTS

Figure 1:
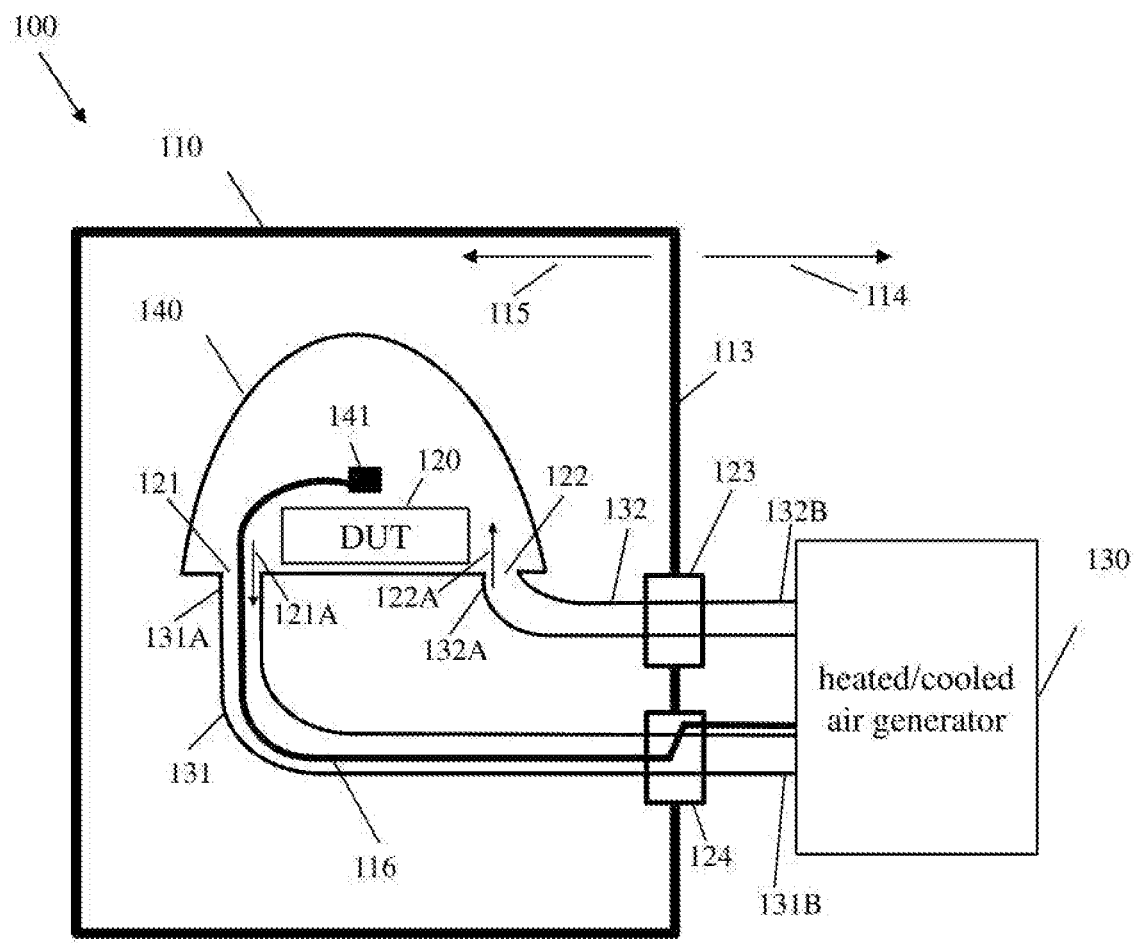
FIG. 1 shows a block diagram of the inventive over-the-air (OTA) test system for measuring a performance of a device under test (DUT) including a thermally isolated hollow body and at least one feedthrough.

FIG. 1 illustrates a block diagram of the inventive over-the-air (OTA) test system for measuring a performance of a device under test (DUT).

Typical OTA test systems, especially OTA performance test systems are used to analyze and optimize the radiated device performance and to validate conformance with industry, network operator and internal company requirements. Specifically, the antenna patterns as well as the transmitter and receiver chain wireless system performance such as Total Radiated Power (TRP), Total Isotropic Sensitivity (TIS) or Total Radiated Sensitivity (TRS), respectively, are verified with an OTA test system. These measurements follow test plans and detailed test and setup procedures published by industry organizations such as Cellular Telecommunications and Internet Association (CTIA) and 3$^{rd}$ Generation Partnership Project (3GPP). Such OTA test systems include an anechoic chamber, positioning equipment, test instruments and automated measurement, software.

Additionally to the aforementioned capabilities, the inventive OTA test system is further capable of conducting performance measurements of a device under test (DUT) as a function of environmental conditions such as temperature, humidity and air-pressure, preferably barometric-pressure.

The inventive OTA test system 100 comprises an over-the-air (OTA) measurement chamber 110 that is provided with at least one feedthrough 123, 124 in one of the walls 113 of the OTA measurement chamber 110. Generally, a feedthrough is used for routing electrical cables, wires or hoses such as air hoses into the inside of a chamber, preferably inside an OTA measurement chamber. Feedthroughs are able to provide integrated strain reliefs or ingress protection to avoid that through the opening in the chamber wall humidity or dust can enter the chamber.

It is conceivable to provide the at least one feedthrough 123, 124 in one of the walls of the OTA measurement chamber as well as in the bottom or in the ceiling of the OTA measurement chamber 110. The feedthrough 123, 124 allows the insertion of a hose 131, 132, preferably an air hose and/or a wire 116 and/or a cable 116 into the OTA measurement chamber 110, and analogously the feedthrough 123, 124 allows to lead out a hose, preferably an air hose and/or a wire and/or a cable out of the OTA measurement chamber. Furthermore, it is conceivable that a feedthrough 123, 124 provides means to insert or lead out several hoses and/or wires and/or cables. The OTA measurement chamber 110 preferably is an anechoic chamber, however measurement setups using a reverberation chamber are conceivable.

Inside 115 the OTA measurement chamber 110 a thermally isolated hollow body 140 is provided that, incorporates a device under test (DUT) 120. The thermally isolated hollow body 140 comprises at least two openings 121, 122. A first end 131A of the first air hose 131 is connected to one 121 of the two openings 121, 122, fed with its second end 131B through the feedthrough 124 to guide the first air hose 131 out 114 of the OTA measurement chamber 110. The second end 131B of the first air hose 131 is further connected to a heated and/or cooled air generator 130 located outside 114 of the OTA measurement chamber 110.

In addition, a first end 132A of the second air hose 132 is connected to one 122 of the two openings 121, 122, fed with its second end 132B through the feedthrough 123 to guide the second air hose 132 out 114 of the OTA measurement chamber 110. The second end 132B of the second air hose 132 is further connected to the heated and/or cooled air generator 130 located outside of the OTA measurement chamber 110.

The arrows 121A, 122A, depicted within FIG. 1 show the direction of the air flow. The arrow 121A drawn near the opening 121 indicates that air is flowing from the thermally isolated hollow body 140 into the first air hose 131 and further into the heated and/or cooled air generator 130. The arrow 122A drawn near the opening 122 indicates that air coming from the heated and/or cooled air generator 130 is flowing via the second air hose 132 into the thermally isolated hollow body 140.

The DUT 120 provided inside the thermally isolated hollow body 140 may be rotatable, tiltable or pivotable.

The two openings 121 and 122 within the thermally isolated hollow body 140 are sealed by connecting the first end 131A of the first air hose 131 and by connecting the first end 132A of the second air hose 132 to the openings such that the thermal isolation properties of the thermally isolated hollow body 140 are maintained despite the openings 121, 122.

Furthermore, inside the thermally isolated hollow body 140 a sensor 141 is located, the sensor is preferably a temperature sensor and/or a humidity sensor and/or a barometric-pressure sensor. It is conceivable that said sensor 141 is located near the DUT 120 as shown in FIG. 1. However, it is further conceivable that the sensor 141 is directly attached to the DUT 120. The sensor is provided with a sensor connection wire or a sensor connection cable 116 for connecting the sensor to the heated and/or cooled air unit 130 and/or to any other device suitable to supply the sensor 141 with voltage and suitable to receive the generated sensor signals and/or to display and/or process the received sensor signals.

The sensor connection wire or cable 116 is fed through the opening 121, the same opening already used to provide air flow from the thermally isolated hollow body 140 into the first air hose 131. Thus, no separate opening is required to insert the sensor connection wire or cable 116 of sensor 141 into the thermally isolated hollow body 140. It is further conceivable that the sensor connection wire or cable 116 is fed through the opening 122, the same opening already used to provide air flow into the thermally isolated hollow body 140.

Feedthrough 123 is provided to feed through the second air hose 132 from the outside 114 of the OTA measurement chamber 110 into the inside 115 of the OTA measurement chamber 110. According to FIG. 1, no sensor connection wire or cable is routed into feedthrough 123. It is however conceivable that a sensor connection wire or cable is guided into the feedthrough 123.

Feedthrough 124 is provided to feed through the first air hose 131 from the outside 114 of the OTA measurement chamber 110 into the inside 115 of the OTA measurement chamber 110. Feedthrough 124 further allows inserting a sensor connection wire or cable 116 at a separate location as the first air hose 131 and embedding the sensor connection wire or cable 116 inside the feedthrough 124 into the first air hose 131.

Figure 2:
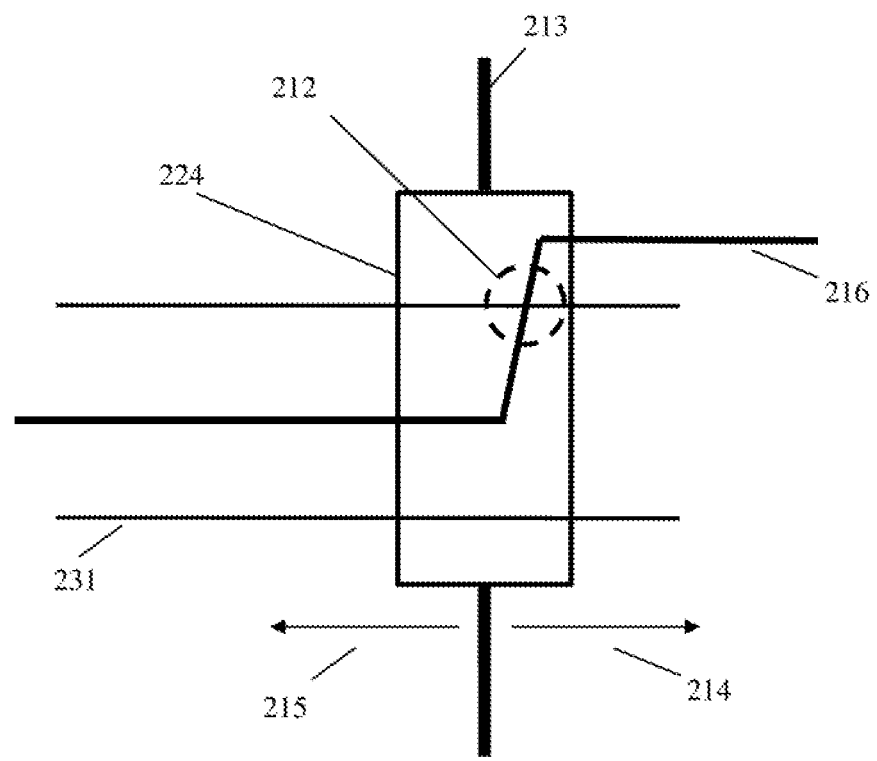
FIG. 2 shows a block diagram with a detailed view of the feedthrough of the inventive OTA test system including the routing of the air hose and connection wire.

A more detailed description of the routing of the first air hose 131 and the sensor connection wire or cable 116 within the feedthrough 124 is given in FIG. 2.

It is further conceivable that at least one connector is provided at the outside of the thermally isolated hollow body 140, preferably at the outside wall of the thermally isolated hollow body 140 and that said connector is providing a connection to the inside of the thermally isolated hollow body 140. The connector is mounted such that any opening required for proving the connection between the outside of the thermally isolated hollow body and the inside of the thermally isolated hollow body is sealed to maintain the thermally isolating properties of the thermally isolated hollow body 140. Said connector allows to easily connecting any wiring outside of the thermally isolated hollow body 140 to any component inside the thermally isolated hollow body 140.

FIG. 2 shows a block diagram with a detailed view of the feedthrough of the inventive OTA test system including the routing of the air hose and the sensor connection wire or cable.

The feedthrough 224 is mounted into the wall 213 of the OTA measurement chamber and is able to receive the first air hose 231 at a separate location than the sensor connection wire or cable 216. The sensor connection wire or cable 216 is routed from the outside 214 of the OTA measurement chamber into the feedthrough 224 and is embedded into the first air hose 231 inside the feedthrough 224. The area where the sensor connecting wire or cable 216 enters the first air hose 231 is indicated with a dashed circle with referral number 212. Said sensor connection wire or cable 216 is fed into the first air hose 231 through a small hole or a small slot made into the first air hose 231. Due to the opening in the first air hose 231 a leakage is generated, which is unwanted and disturbs the air flow within the first air hose.

Advantageously, the opening in the first air hose 231 is located within the feedthrough 224 and the feedthrough 224 serves as a sealing means ensuring that the leakage is sealed.

Figure 3A:
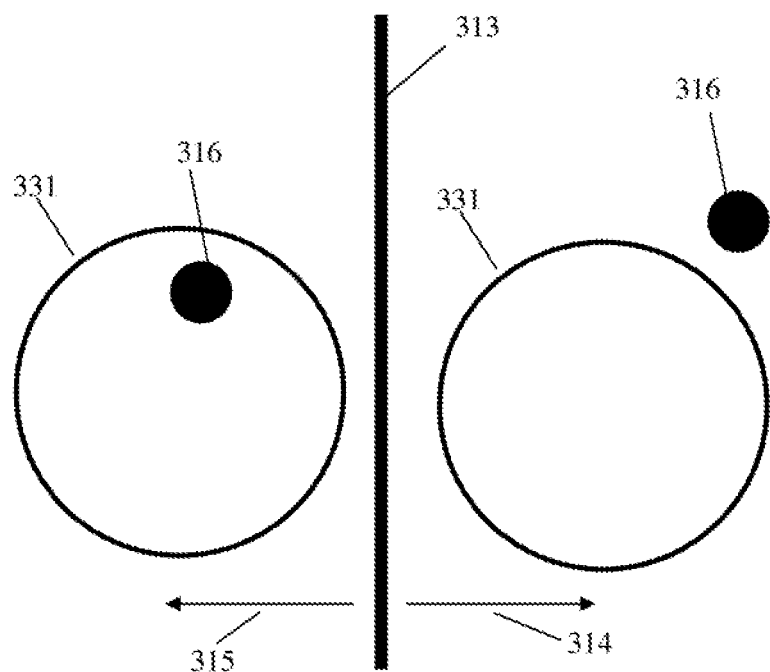
FIG. 3A shows a block diagram with a detailed view of the position of the connection wire with respect to the air hose, outside and inside the OTA measurement chamber.

FIG. 3A illustrates an exemplary embodiment of the inventive test system with a detailed view of the position of the connection wire or cable with respect to the air hose outside and inside the OTA measurement chamber.

FIG. 3A shows a cross-sectional view through the first air hose 331 and the sensor connection wire or cable 316 outside 314 and inside 315 the OTA measurement chamber. Outside 314 the OTA measurement chamber 110 the sensor connection wire or cable 316 is routed outside the first air hose 331. The first air hose 331 enters the feedthrough (not shown) at a separate location as the sensor connection wire or cable 316 (not shown). At the inside 315 of the OTA measurement chamber the sensor connection wire 316 is finally located inside the first air hose 331 and guided within the first air hose 331 through the opening 121 (not shown) into the thermally isolated hollow body. In other words, outside 314 the OTA measurement chamber the sensor connection wire or cable 316 is routed separately from the first air hose 331. Inside 315 the OTA measurement chamber the sensor connection wire or cable 316 is routed within the first air hose 331.

Figure 3B:
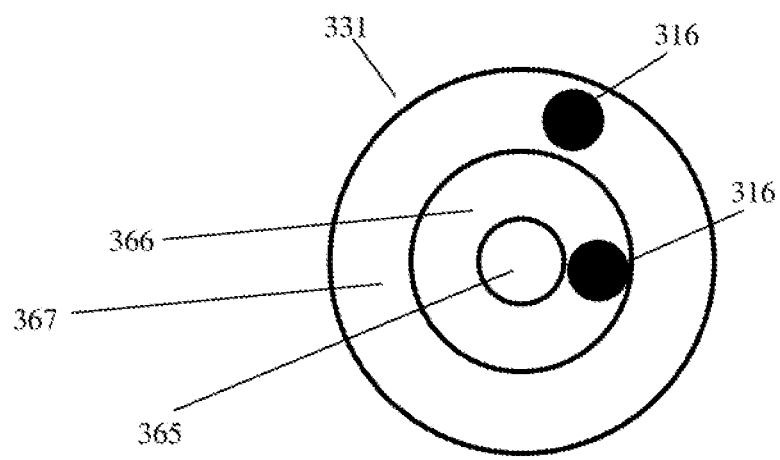
FIG. 3B shows a block diagram with a detailed view of the position of the connection wire with respect to the air hose inside the OTA measurement chamber for an air hose with two layers.

FIG. 3B illustrates an exemplary embodiment of the inventive test system with a detailed cross-sectional view of the position of the connection wire or cable with respect to the air hose inside the OTA measurement chamber for an air hose with two layers.

The air hose 131, 132 is preferably thermally isolated to ensure that the temperature of the air flowing within the air hose does not affect the temperature within the OTA measurement chamber and vice versa. It is conceivable that the air duct 365 for guiding the air inside the air hose 331 is surrounded by one or more layers 366, 367 made of a material having thermally isolating properties. Depending on the temperature sensitivity of the sensor connection wire or cable, said wire or cable 316 can be inserted into the air duct 365, into the first layer 366 adjacent to the air duct 365 or into the second layer 367 adjacent to the first layer 366. Thus, the more sensitive the sensor connection wire or cable is for high or low temperatures, the farer away from the air duct the wire or cable is positioned.

Figure 4:
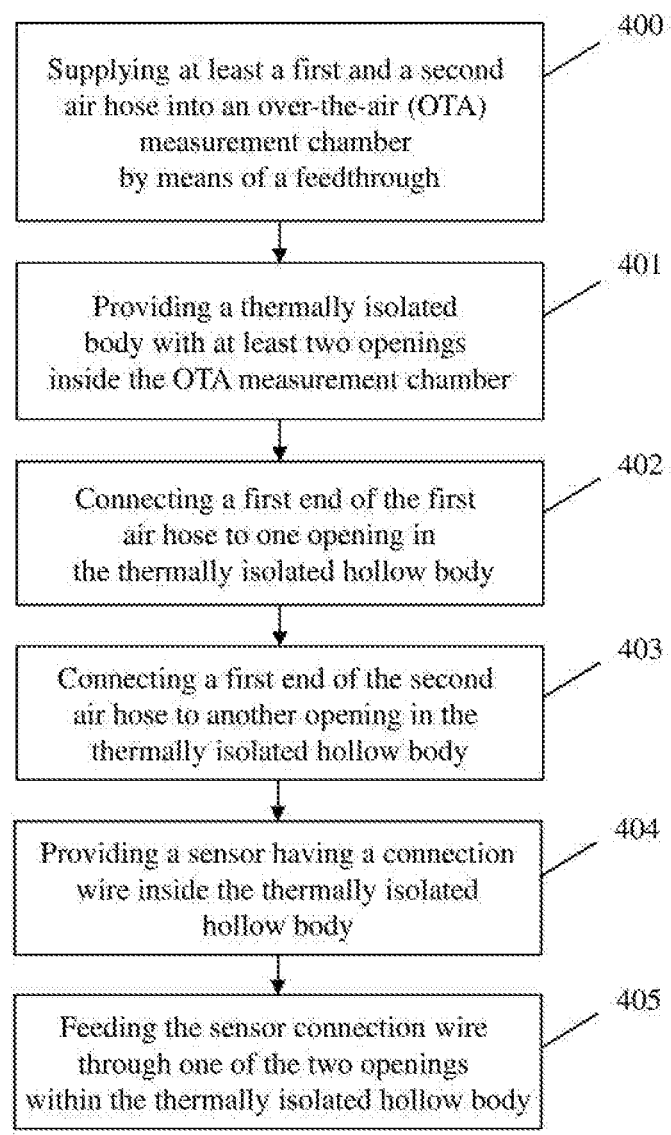
FIG. 4 shows a flow chart of an exemplary embodiment of a measurement method of the second aspect of the invention.

Finally, FIG. 4 shows a flow chart of the inventive measurement method. In a first step S400 at least a first air hose 131 and a second air hose 132 are supplied into an over-the-air (OTA) measurement chamber 110 by means of a feedthrough 123, 124.

The feedthrough allows to feed a hose, preferably an air hose and/or a wire and/or a cable through an enclosure or through a wall of an OTA measurement chamber. Such feedthroughs allow feeding a hose and/or a wire and/or a cable from the outside of the enclosure or OTA measurement chamber to the inside of the enclosure or chamber. Such feedthroughs further allow feeding a hose and/or a wire and/or a cable from the inside of the enclosure or OTA measurement chamber to the outside of the enclosure or OTA measurement chamber.

In a following step S401 a thermally isolated hollow body 140 with at least two openings 121, 122 is provided within the OTA measurement chamber 110.

In a further step S402 a first end 131A of the first air hose 131 is connected to one opening 121 in the thermally isolated hollow body 140.

In a following step S403 a first end 132A of the second air hose 132 is connected to another opening 122 in the thermally isolated hollow body 140.

In a further step S404 a sensor 141 having a connection wire or cable 116 is provided inside the thermally isolated hollow body 140.

Finally, in a last step S405 the sensor connection wire or cable 116, in other words the connection wire or cable 116 the sensor 141 is provided with, is fed through one of the two openings 121, 122 in the thermally isolated hollow body 140.

While various embodiments of the present invention have been described above, it should be understood that they have been presented by way of example only, and not for limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An over-the-air (OTA) test system for measuring a performance of a device under test (DUT), the system comprising:
   an over-the-air (OTA) measurement chamber provided with at least one feedthrough for at least a first air hose and a second air hose,
   a thermally isolated hollow body inside the OTA measurement chamber, in which the DUT is positioned having at least two openings for connecting a first end of each of the first and the second air hose,
   at least one sensor having a connection wire, located within the thermally isolated hollow body, wherein the sensor connection wire is fed through one of the two openings into the thermally isolated hollow body, and a heated and/or cooled air generator which provides air that flows via at least one of the first or the second air hose into the thermally isolated hollow body.

2. The test system according to claim 1, wherein the sensor connection wire enters in the feedthrough of the OTA measurement chamber at a separate location as the first and/or the second air hose.

3. The test system according to claim 2, wherein the sensor connection wire passes through the feedthrough and is embedded into the first air hose and/or the second air hose inside the feedthrough of the OTA measurement chamber.

4. The test system according to claim 1, wherein the system further includes the heated and/or cooled air generator to control the ambient conditions within the thermally isolated hollow body.

5. The test system according to claim 4, wherein a second end of the first air hose and/or the second air hose is connected to the heated and/or cooled air generator.

6. The test system according to claim 5, wherein the first air hose is used for air intake into the thermally isolated hollow body and/or wherein the second air hose is used for air outtake of the thermally isolated hollow body.

7. The test system according to claim 1, wherein at least one of the one or more sensors is a temperature sensor and/or a humidity sensor and/or an air-pressure sensor.

8. The test system according to claim 1, wherein the at least one sensor is directly attached to the DUT.

9. The test system according to claim 1, wherein the at least one sensor is positioned near the DUT.

10. The test system according to claim 1, wherein the thermally isolated hollow body is made of a radio frequency (RF) transparent material.

11. The test system according to claim 7, wherein said temperature sensor is configured to measure the temperature of a DUT and to transmit the measurement data to a heated and/or cooled air generator.

12. The test system according to claim 7, wherein said humidity sensor is configured to measure the humidity or condensation within the thermally isolated hollow body and to transmit the measurement data to a heated and/or cooled air generator.

13. The test system according to claim 12, wherein, if the measured humidity or condensation is above a predefined level, the air goes through several heating and cooling cycles to remove the humidity or condensation.

14. A method for measuring a performance of a device under test (DUT) the method comprising the steps of:
supplying at least a first air hose and a second air hose into an over-the-air (OTA) measurement chamber by means of a feedthrough,
providing inside the OTA measurement chamber a thermally isolated hollow body with at least two openings,
connecting a first end of the first air hose to one opening in the thermally isolated hollow body,
connecting a first end of the second air hose to another opening in the thermally isolated hollow body,
providing a sensor having a connection wire inside the thermally isolated hollow body,
feeding the sensor connection wire through one of the two openings within the thermally isolated hollow body, and
providing air from a heated and/or cooled air generator via at least one of the first or the second air hose into the thermally isolated hollow body.

15. The method according to claim 14, wherein the method further comprises the step of
guiding the sensor connection wire outside the first and second air hose outside the OTA measurement chamber,
embedding the sensor connection wire inside the first and/or the second air hose within the feedthrough,
guiding the sensor connection wire inside the first and/or second air hose inside the OTA measurement chamber.

16. The method according to claim 15, wherein the method further comprises the step of
guiding the sensor connection wire such that it enters in the feedthrough within the OTA measurement chamber at a separate location as the first and/or second air hose.

17. The method according to claim 14, wherein the method further comprises the step of
positioning the at least one sensor inside the thermally isolated hollow body such that the sensor is located near the DUT and/or such that the sensor is directly attached to the DUT.

18. The method according to claim 14, wherein the method further comprises the step of
controlling the ambient conditions within the thermally isolated hollow body with the aid of the heated and/or cooled air generator based on received sensor data from at least one sensor inside the thermally isolated hollow body.

* * * * *